United States Patent [19]
Yajima

[11] Patent Number: 6,002,086
[45] Date of Patent: Dec. 14, 1999

[54] ASSEMBLY STRUCTURE OF A PLURALITY OF SHIELD CASINGS

[75] Inventor: Hideo Yajima, Kanagawa, Japan

[73] Assignee: Mitsumi Electric Co., Ltd., Tokyo, Japan

[21] Appl. No.: 08/975,700

[22] Filed: Nov. 21, 1997

[51] Int. Cl.⁶ .................................................. H05K 9/00
[52] U.S. Cl. ........................ 174/35 R; 174/51; 361/816
[58] Field of Search ...................... 174/35 R, 35 GC, 174/51; 361/753, 799, 816, 800, 818

[56] References Cited

U.S. PATENT DOCUMENTS

| | | | |
|---|---|---|---|
| 5,353,201 | 10/1994 | Maeda | 361/816 |
| 5,354,951 | 10/1994 | Lange, Sr. et al. | 174/35 R |
| 5,557,507 | 9/1996 | Koike et al. | 361/816 |
| 5,559,676 | 9/1996 | Gessaman | 361/752 |
| 5,748,449 | 5/1998 | Tahmassebpur | 361/753 |

FOREIGN PATENT DOCUMENTS

| | | |
|---|---|---|
| 0 576 344 A1 | 12/1993 | European Pat. Off. . |
| 2148568 | 4/1973 | Germany . |
| 06039461 | 2/1994 | Japan . |

OTHER PUBLICATIONS

European Search Report dated Apr. 13, 1999.

*Primary Examiner*—Kristine Kincaid
*Assistant Examiner*—Ronnie Mancho
*Attorney, Agent, or Firm*—Whitham, Curtis & Whitham

[57] ABSTRACT

An assembly structure having a plurality of shield casings which are polygonal and substantially equal in cross section. The shield casings are stacked in a direction of their height. A shield cover is interposed between the shield casings. The shield cover is made up of a flat plate that covers the bottom surface of a first shield casing, the top surface of a second shield casing, and retaining springs that extend upward and downward from the outer edges of the flat plate. The retaining springs press against the walls of the first and second shield casings.

6 Claims, 3 Drawing Sheets

ASSEMBLY STRUCTURE OF A PLURALITY OF SHIELD CASINGS

BACKGROUND OF THE INVENTION

1. Field of the Invention

This invention relates to an assembly of shield casings stacked in a direction of height, and more particularly to a plurality of shield casings having an intermediate flat plate disposed there between.

2. Related Art

Heretofore, as shown in FIG. 3, in an antenna unit 1 first and second shield casings 61 and 62 are provided between an antenna cover 2 and a base 3 in such a manner that those casings 61 and 62 are stacked in the direction of height thereof. The first shield casing 61 accommodates a GPS antenna section for receiving signals from a GPS satellite. The GPS antenna section comprises a patch antenna, a signal receiving circuit, an RF converter. The second shield casing 62 accommodates a tuner section which comprises an FM tuner section, a digital demodulator section, and a connector.

The first and second shield casings 61 and 62 are made of a metal sheet, and are equal and rectangular in cross section. The top surface and the bottom surface of the first shield casing 61 are covered with a top surface shield cover 71 and a bottom surface shield cover 72 which are both made of a metal plate. Similarly, the top surface and the bottom surface of the second shield casing 62 are covered with a top surface shield cover 73 and a bottom surface shield cover 74 which are both made of a metal plate.

The shield covers 71, 72, 73 and 74 are made up of: flat plates 71A, 72A, 73A and 74A which covers the top surfaces and the bottom surfaces of the two shield casings 61 and 62; and several side surface retaining springs 80 which press against the side walls of the shield casings 61 and 62. The retaining springs 80 are extended from the outer edges of the flat plates 71A, 72A, 73A and 74A, and are bent upwardly or downwardly depending on the positions of the flat plates 71A through 74A.

The retaining springs 80 have holes 85 as shown in FIG. 4, while side walls (four side walls) of the first and second shield casings 61 and 62 have protrusions 65 which are engaged with the aforementioned holes 85.

The above-described antenna unit 1 is assembled as follows: First, the GPS antenna section is built in the first shield casing 61, and then shield casing 61 is covered with the top surface shield cover 71 and the bottom surface shield cover 72. Next, the tuner section is built in the second shield casing 62, and the latter 62 is covered with the top surface shield cover 73 and the bottom surface shield cover 74. Thereafter, the first shield casing 61 with the shield covers 71 and 72 is mounted on the second shield casing 62 with the shield covers 73 and 74 through an insulating sheet 90, and the first and second shield casings 61 and 62 are secured to each other with suitable means.

As was described above, heretofore in the case where the first and second shield casings 61 and 62 which are polygonal and substantially equal in cross section are stacked in the direction of height thereof, the following method is employed: The first and second shield casings 61 and 62 are assembled separately, and in the final assembling step the shield casing 61 is mounted on the second shield casing 62. Hence, the shield casings 61 and 62 need four shield covers 71 through 74, two shield covers for each shield casing. Additionally, it is essential to place the insulating sheet between the first and second shield casings 61 and 62, and therefore the resultant antenna unit is relatively high in manufacturing cost. Furthermore, the first and second shield casings 61 and 62 thus stacked must be fixedly positioned. That is, it is rather troublesome to assemble the conventional antenna unit.

SUMMARY OF THE INVENTION

In view of the foregoing, an object of the invention is to provide the assembly structure of a plurality of shield casings which reduces component cost and allows the shield casings to be assembled with ease.

The foregoing object of the invention has been achieved by providing an assembly structure that utilizes a plurality of shield casings which are designed so that the first and second shield casings which are substantially equal in cross section are stacked in a direction of height thereof; in which, according to the invention, an intermediate shield cover is interposed between the first and second shield casings, the intermediate shield cover including: a flat plate which covers not only the bottom surface of the first shield casing but also the top surface of the second shield casing; first side wall retaining springs which are extended from the outer edges of the flat plate and bent upwardly, to press against the side walls of the first shield casing; and second side wall retaining springs which are extended from the outer edges of the flat plate and bent downwardly, to press against the side walls of the second shield casing.

In the above-described assembly structure, it is preferable that the first and second shield casings have protrusions, while the first and second side wall retaining springs have recesses which are engaged with the protrusions, respectively, and vice versa.

Furthermore, it is preferable that the first and second shield casings have the protrusions or recesses at predetermined intervals, and the intermediate shield cover have the first side wall retaining springs and the second side wall retaining springs alternately at predetermined intervals.

The first and second shield casings are assembled as follows: For instance, an electronic unit such as a GPS antenna is built in the first shield casing, and only the top surface of the latter is covered with a top surface shield cover; and an electronic unit such as a tuner unit is built in the second shield casing, and only the bottom surface of the latter is covered with a bottom surface shield cover. Under this condition, the top surface of the second shield casing is covered with the intermediate shield cover. Thereafter, the above-described first shield casing in mounted on the intermediate shield cover in such a manner that the bottom surface of the first shield casing is covered with the intermediate shield cover.

In this case, the intermediate shield cover is fixedly held on the second shield casing by the elastic action of the second side wall retaining springs, while the first shield casing is fixedly held on the intermediate shield cover by the elastic action of the first side wall retaining springs.

As was described above, in the assembly structure of a plurality of shield casing according to the invention, the intermediate shield cover is interposed between the first and second shield casings which serves not only as the bottom shield cover of the first shield casing but also as the top shield cover of the second shield casing. Hence, in the case of stacking the two shield casings and, when compared with the conventional case of stacking the shield casings, the number of shield covers is reduced by one (that is, three shield covers are used, while four shield covers are employed in the prior art). Furthermore, it is unnecessary to use the insulating sheet, which results in a reduction in component cost. In addition, the first and second shield casings, which should be stacked vertically, can be readily positioned and secured to each other; that is, the assembly characteristic is markedly improved.

DETAILED DESCRIPTION OF THE PREFERRED EMBODIMENTS

An embodiment of this invention will be described with reference to the accompanying drawings.

Figure 1:
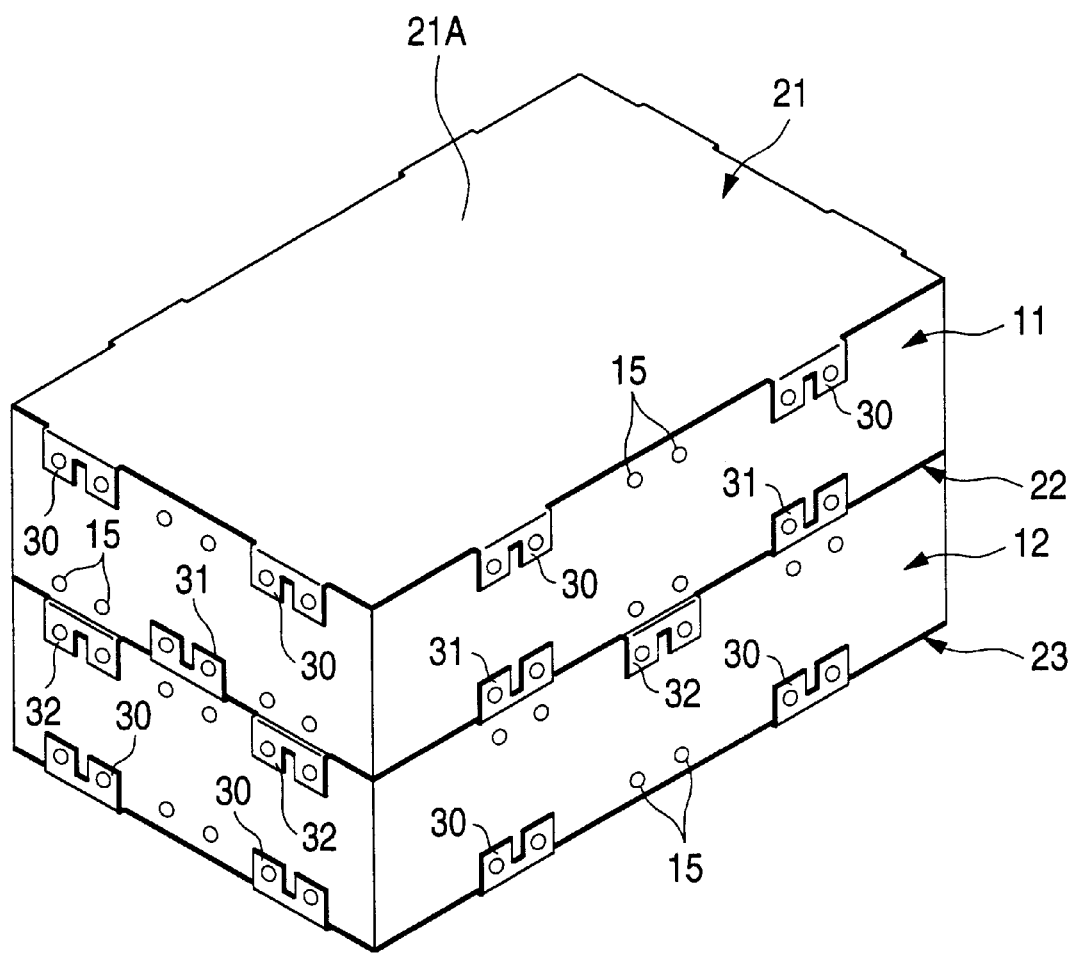
FIG. 1 is a perspective view showing the assembly structure of a plurality of shield casings according to the invention.
Figure 2:
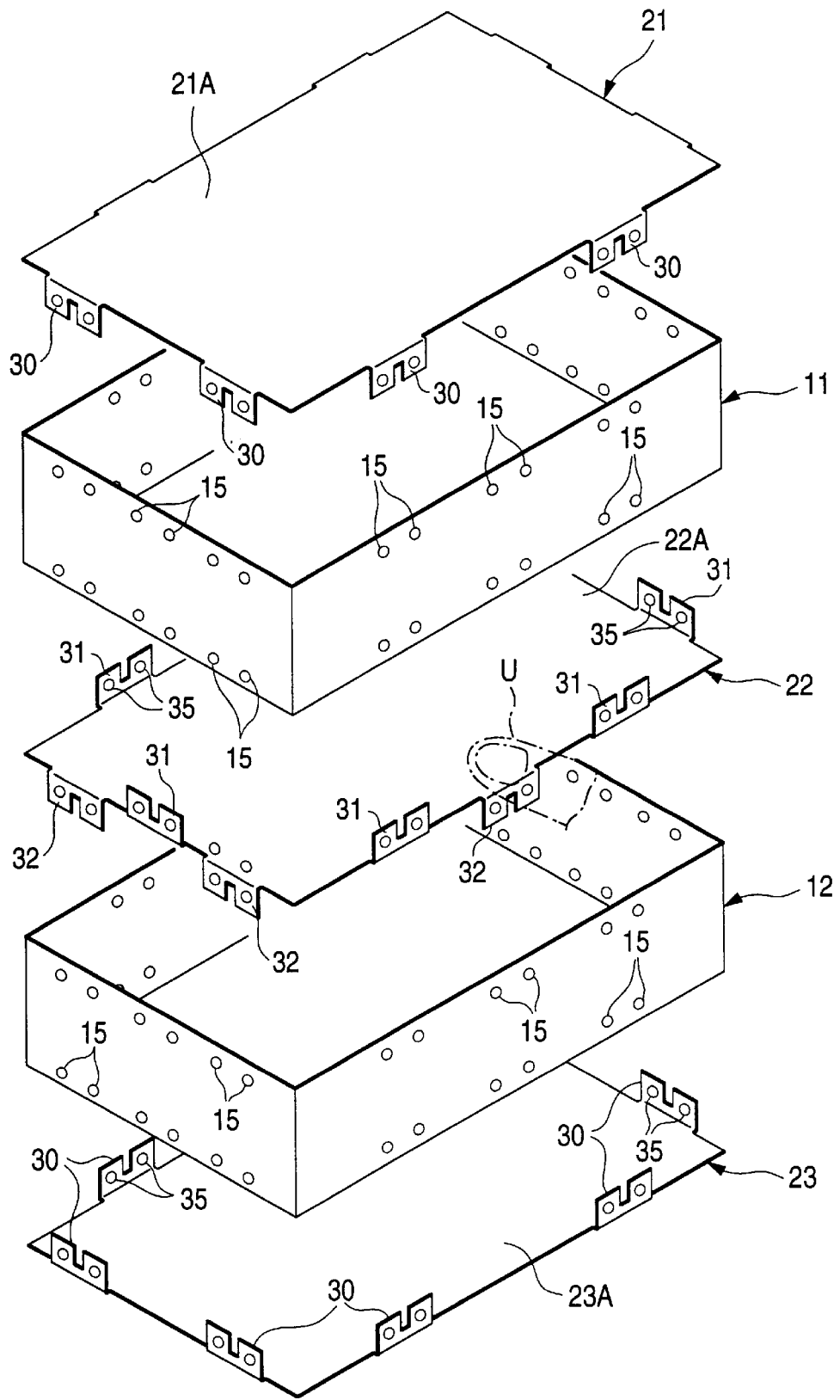
FIG. 2 is an exploded perspective view showing the assembly structure illustrated in FIG. 1.
Figure 3:
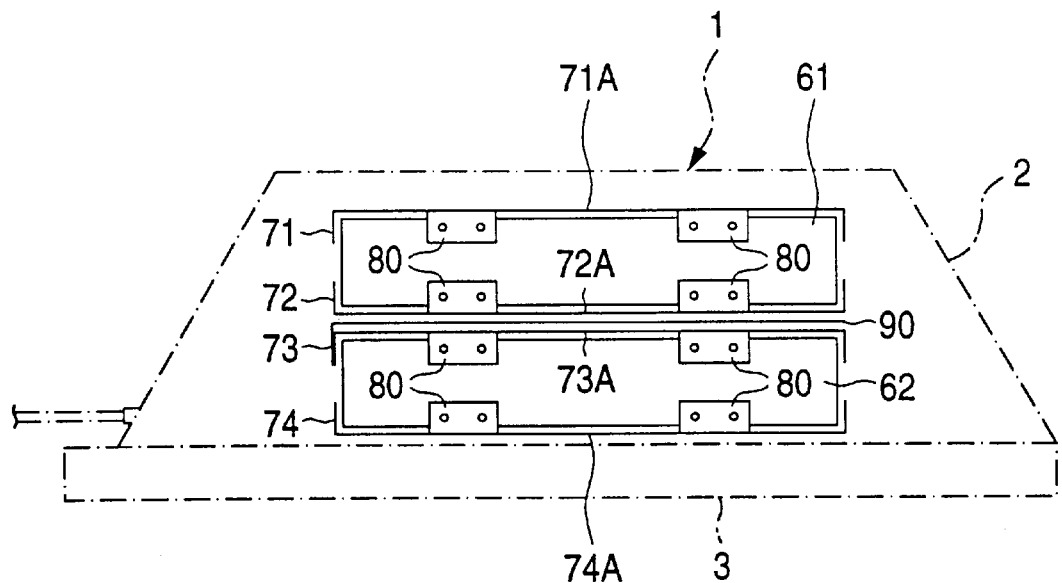
FIG. 3 is a diagram for a description of a conventional assembly structure of a plurality of shield casings.

FIGS. 1 and 2 are a perspective view and an exploded perspective view, respectively, showing the assembly structure of a plurality of shield casings, which constitutes the embodiment of the invention.

The assembly structure shown in FIG. 2 may be utilized, for example, with an antenna unit provided for a car navigation system. First and second shield casings 11 and 12 are provided between an antenna cover and a base in such a manner that those casings are stacked in the direction of height thereof. The first shield casing 11 accommodates a GPS antenna section for receiving signals from a GPS satellite. The GPS antenna section comprises a patch antenna, a signal receiving circuit, an RF converter. The second shield casing 62 accommodates a tuner section which comprises an FM tuner section, a digital demodulator section, and a connector.

The first and second shield casings 11 and 12 are made of a metal sheet, and are substantially equal in cross-section. The top surface of the first shield casing 11 is covered with a top surface shield cover 21 which is made of a metal plate, while the bottom surface of the second shield casing 12 is covered with a bottom surface shield cover 23 which is also made of a metal plate.

As shown best in FIG. 2, the top shield cover 21 is made up of: a flat plate 21A which covers the top surface of the shield casing 11; and several fork-shaped side surface retaining springs 30, 30, . . . which press against the side walls of the shield casing 11. The retaining springs 30 are extended from the outer edges of the flat plates 21A, and are bent downwardly. Similarly, the bottom shield cover 23 is made up of; a flat plat 23A which covers the bottom surface of the shielding casing 11; and several fork-shaped side surface retaining spring 30, 30, . . . which press against the side walls of the shield casing 12. The retaining spring 30 are extended from the outer edges of the flat plates 23A, and are bent upwardly.

In the embodiment, an intermediate shield cover 22 is interposed between the first shield casing 11 and the second shield casing 12. The intermediate shield cover 22 is made up of: a flat plate 22A which covers both the bottom surface of the first shield casing 11 and the top surface of the second shield casing 12; a plurality of first side surface retaining springs 31, 31, . . . which are extended from predetermined parts of the outer edges of the flat plate 22A and bent upwardly to be pressed against the side walls of the first shield casing 11; and a plurality of second side surface retaining springs 32, 32, . . . which are extended from predetermined parts of the outer edges of the flat plate 22A and bent downwardly to be pressed against the side walls of the second shield casing 12.

Figure 4:
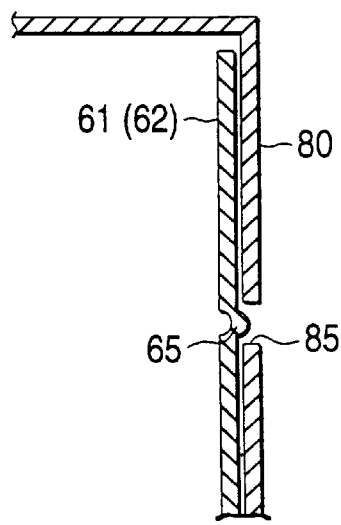
FIG. 4 is a diagram for a description of the connection of a shield casing and a shield cover.

Each of the retaining springs 30, 31 and 32, similarly as in the case of the aforementioned retaining springs 80 shown in FIG. 4, has a pair of holes 35 and 35; while the first and second shield casings 11 and 12 have pairs of protrusions 15 so that every other pair of protrusions 15 are engaged with the holes 35 of the retaining spring 30.

In the embodiment, the shield covers 21, 22 and 23 have the side wall retaining springs 30, 31 and 32, respectively, and the shield casings 11 and 12 have the pairs of protrusions 15. Hence, the top surface shield cover 21 and the bottom surface shield cover 23 may be equal in configuration to each other, and the first shield casing 11 and the second shield casing 12 may be equal in configuration to each other. This feature reduces the metal mold cost as much, and eliminates the difficulty that, in the assembling work, the top surface shield cover and the bottom surface shield cover must be used separately, and the first shield casing and the second shield casing must be used separately, too; that is, the top surface shield cover may be used as the bottom surface shield cover, and vice versa; and the first shield casing may be used as the second shield casing, and vice versa.

The structure, the embodiment of the invention, is assembled as follows: For instance, an electronic unit such as a GPS antenna is built in the first shield casing 11, and the top surface shield cover 21 is mounted on the first shield casing 11. And an electronic unit such as a tuner is built in the second shield casing 12, and the bottom surface shield cover 23 is mounted on the second shield casing 12. Under this condition, the intermediate shield cover 22 is mounted on the second shield casing 12.

In this work, the flat plate 22A is pressed down with the finger set between the pair of first side wall retaining springs 31 and 31 as indicated by the phantom line in FIG. 2. As a result, the pairs of protrusions 15 formed on the upper portions of the side walls of the second shield casing 12 are engaged with the holes 35 of the second side wall retaining springs 32 of the intermediate shield cover 22. Thus, owing to the action of the second side wall retaining springs, the intermediate shield cover 22 is fixedly secured to the second shield casing 12.

After the top surface of the second shield casing 12 has been covered with the intermediate shield cover 22, the first shield casing 11 is mounted on the intermediate shield cover 22 in such a manner that the pairs holes 35 of the first side wall retaining springs 31 are fixedly engaged with the pairs of protrusions 15 formed in the lower portions of the side walls of the first shield casing 11. In this case. In owing to the action of the first side wall retaining springs 31, the intermediate shield cover 22 is fixedly secured to the first shield casing 11.

As was described above, in the embodiment, the intermediate shield cover 22 is interposed between the first and second shield casings 11 and 12 which serves not only as the bottom shield cover of the first shield casing 11 but also as the top shield cover of the second shield casing 12. Hence, in the case of stacking the two shield casings 11 and 12, when compared with the conventional case of stacking the shield casings, the number of shield covers is reduced by one (that is, three shield covers are used, while four shield covers are employed in the prior art). Furthermore, it is unnecessary to use the insulating sheet, which results in a reduction in component cost. In addition, the first and second shield casings 11 and 12, which should be stacked vertically, can be readily positioned and secured to each other; that is, the embodiment is high in assembling characteristic.

As was described above, in the assembly structure of a plurality of shield casings according to the invention, the intermediate shield cover is interposed between the first and second shield casings which serves not only as the bottom shield cover of the first shield casing but also as the top shield cover of the second shield casing. Hence, in the case of stacking the two shield casings and, when compared with the conventional case of stacking the shield casings, the number of shield covers is reduced by one (that is, three shield covers are used, while four shield covers are employed in the prior art). Furthermore, it is unnecessary to use the insulating sheet, which results in a reduction in component cost. In addition, the first and second shield casings, which should be stacked vertically, can be readily positioned and secured to each other; that is, the assembling characteristic is markedly improved.

What is claimed is:

1. An assembly structure comprising:
    a first shield casing and a second shield casing, said first and second shield casings being polygonal and substantially equal in cross section, said first and second shield casings being vertically stacked in a direction of a height of said first and second shield casings;
    an intermediate shield cover interposed between said first and second shield casings, said intermediate shield cover including:
    a flat plate covering a bottom surface of said first shield casing and a top surface of said second shield casing;
    upwardly extending fork shaped side wall retaining springs extending upward from outer edges of said flat plate and pressing against side walls of said first shield casing; and
    downwardly extending fork shaped side wall retaining springs extending downward from the outer edges of said flat plate and pressing against side walls of said second shield casing, where said downwardly extending fork shaped side wall retaining springs are positioned at an offset location on outer edges of said flat plate with respect to said upwardly extending fork shaped side wall retaining springs.

2. An assembly structure according to claim 1, wherein said first and second shield casings have protrusions, and said upwardly extending fork shaped side wall retaining springs and said downwardly extending fork shaped side wall retaining springs have recesses which are engaged with said protrusions, respectively.

3. An assembly structure according to claim 2, wherein each said first and second shield casing protrusions and said upwardly extending fork shaped side wall retaining springs and said downwardly extending fork shaped side wall retaining springs are placed at predetermined intervals, and alternate with respect to one another.

4. An assembly structure according to claim 1, wherein said upwardly extending fork shaped side wall retaining springs and said downwardly extending fork shaped side wall retaining springs are placed at predetermined intervals.

5. An assembly structure according to claim 1, wherein said intermediate shield cover has a cross section substantially equal to that of said first and second shield casings.

6. An assembly structure according to 1, wherein said upwardly extending fork shaped side wall retaining springs and said downwardly extending fork shaped side wall retaining springs alternate with respect to one another.

* * * * *